United States Patent [19]
Kwon

[11] Patent Number: 5,915,173
[45] Date of Patent: Jun. 22, 1999

[54] THIN FILM TRANSISTOR AND METHOD FOR FABRICATING THE SAME

[75] Inventor: Sung Woo Kwon, Kyoungkido, Rep. of Korea

[73] Assignee: Hyundai Electronics Industries Co., Ltd., Kyoungkido, Rep. of Korea

[21] Appl. No.: 09/084,239

[22] Filed: May 26, 1998

Related U.S. Application Data

[62] Division of application No. 08/501,616, Jul. 12, 1995.

[30] Foreign Application Priority Data

Jul. 13, 1994 [KR] Rep. of Korea .................. 1994-16876
Jul. 15, 1994 [KR] Rep. of Korea .................. 1994-17157

[51] Int. Cl.$^6$ .................................................. H01L 21/336
[52] U.S. Cl. ............................................ 438/161; 438/159
[58] Field of Search ..................... 438/197, 161, 438/158, 159, 160, 151, 149, 479, 482, 491, DIG. 150, FOR 183, FOR 200, 488

[56] References Cited

U.S. PATENT DOCUMENTS

| | | | |
|---|---|---|---|
| 4,727,044 | 2/1988 | Yamazaki ................................. | 438/166 |
| 4,951,113 | 8/1990 | Huang et al. ............................ | 438/154 |
| 5,037,766 | 8/1991 | Wang ....................................... | 438/161 |
| 5,053,347 | 10/1991 | Wu ........................................ | 437/40 TFI |
| 5,198,379 | 3/1993 | Adan ...................................... | 437/41 TFI |
| 5,340,999 | 8/1994 | Takeda et al. ............................ | 257/66 |
| 5,366,909 | 11/1994 | Song et al. .............................. | 438/161 |
| 5,455,182 | 10/1995 | Nishimoto et al. ................. | 437/40 TFI |
| 5,488,005 | 1/1996 | Han et al. .............................. | 438/163 |
| 5,840,602 | 11/1998 | Han et al. .............................. | 438/161 |

FOREIGN PATENT DOCUMENTS

| | | | |
|---|---|---|---|
| 59-149060 | 8/1984 | Japan ................................. | 437/40 TFI |
| 61-185724 | 8/1986 | Japan ................................. | 437/40 TFI |
| 3-34464 | 2/1991 | Japan ........................... | 438/FOR 183 |
| 3034464 | 2/1991 | Japan ................................. | 437/40 TFI |
| 3114234 | 5/1991 | Japan ................................. | 437/40 TFI |
| 4-120738 | 4/1992 | Japan ........................... | 438/FOR 184 |
| 2118774 | 11/1983 | United Kingdom . | |
| 92-186880 | 7/1992 | United Kingdom . | |
| WO92/06497A1 | 4/1992 | WIPO . | |
| WO92/06504A1 | 4/1992 | WIPO . | |

*Primary Examiner*—Michael Trihn
*Attorney, Agent, or Firm*—V E N A B L E; Norman N. Kunitz

[57] ABSTRACT

Disclosed is a thin film transistor formed on a substrate, comprising a patterned gate electrode formed on said substrate; a channel layer formed around said gate electrode with a gate insulating layer interposed therebetween; a interlayer insulating layer formed on said channel layer; and source and drain electrodes formed on both side walls of said channel layer and on both side portions of said interlayer insulating layer, and isolated from each other. Each of the channel and source/drain layers is composed of polysilicon with impurity ions. In the thin film transistor, because each of the source and drain electrodes is formed relatively thicker than the channel layer, them can be significantly reduced in resistance.

4 Claims, 6 Drawing Sheets

THIN FILM TRANSISTOR AND METHOD FOR FABRICATING THE SAME

This is a division of application Ser. No. 08/501.616 filed Jul. 12, 1995, pending.

BACKGROUND OF THE INVENTION

1. Field of the Invention

The present invention relates to a novel thin film transistor and a method for its fabrication. More particularly, the invention relates to a novel thin film transistor having a relatively thick source/drain electrode to a channel and a method for fabricating the same.

2. Description of the Prior Art

In a prior art thin film transistor, as shown in FIG. 1, a gate electrode 1 of polycrystalline silicon (hereinafter, referred to as "polysilicon") is formed on a substrate (not shown)., a gate insulating layer 2 is formed on the gate electrode and the substrate, and a polysilicon layer 3 is formed on the gate insulating layer 2. The polysilicon layer 3 is classified into source and drain electrodes 3A and 3B which are formed at both sides of the gate electrode 1, and a channel region 3C which is located between the source and drain electrodes 3A and 3B, as shown in FIG. 1. Particularly, it can be seen from FIG. 1 that, since the source and drain electrodes 3A and 3B and the channel region 3C constitute only one polysilicon layer, each of the electrodes has the same thickness as the channel region.

In the thin film transistor (hereinafter, referred to as "TFT") having the above mentioned structure, the channel region 3C has to be provided as thin as possible, so as to reduce OFF-current of the TFT. However, since each of the source and drain electrodes 3A and 3B comprises the same polysilicon larger or of the channel region 3C, this results in the source and drain electrodes having formed thinner. Thus, there is a problem that ON-current of the TFT is reduced due to increase in resistance of each of the source and drain electrodes.

In addition, when a following process is performed for forming a metal contact on the source and drain electrodes, there is a further problem that a metal layer can not be directly in contact with the source and drain electrodes because each of the source and drain electrodes is composed of a shallow polysilicon layer.

In case the TFT is embodied as a load in an SRAM (Static Random Access Memory), it is necessary to perform an additional process for forming a drain contact. Thus, when such an additional process is performed for forming a drain contact, there is another problem that a gate oxide layer inevitably becomes damaged.

SUMMARY OF THE INVENTION

It is an object of the present invention to provide a thin film transistor in which channel and source/drain regions, which are composed of polysilicon, are stacked with each other, and the source/drain region is formed relatively thicker than the channel region, so as to improve characteristics thereof.

It is the other object of the present invention to provide a method for fabricating a thin film transistor in which channel and source/drain regions, which are composed of polysilicon, are stacked with each other, and the source/drain region is formed relatively thicker contact the channel region, so as to improve characteristics thereof.

The thin film transistor according to the aspect of the present invention, comprises a patterned gate electrode formed on a substrate; a channel layer formed around said gate electrode with a gate insulating layer interposed therebetween; an interlayer insulating layer formed on said channel layer; and source and drain electrodes formed on both side walls of said channel layer and on both side portions of said interlayer insulating layer, and isolated from each other.

In the transistor, each of said source and drain electrodes is formed relatively thicker than said channel layer.

The method for fabricating a thin film transistor according to a further aspect of the present invention, comprises the steps of depositing a first conductive layer on a substrate and patterning said first conductive layer using a gate forming mask to form a gate electrode; sequentially forming a gate insulating layer, a second conductive layer for a channel and an interlayer insulating layer on said gate electrode and said substrate; selectively etching said sequentially formed layers using a channel forming mask until a surface of said substrate is exposed; forming a third conductive layer on said interlayer insulating layer and said exposed surface of said substrate and on both side walls of said second conductive layer; and selectively etching said third conductive layer using a source/drain forming mask to form source and drain electrodes.

In the method, each of said source and drain electrodes is formed relatively thicker than said channel layer.

In the method, each of said first, second and third conductive layers comprises polysilicon.

In the method, said interlayer insulating layer comprises oxide or nitride.

The thin film transistor according to another aspect of the present invention, comprises a first conductive layer formed on a substrate, said first conductive layer being provided to form source and drain electrodes isolated from each other; a second conductive layer formed between said source and drain electrodes and formed upward said source and drain electrodes with an insulating layer interposed therebetween, said second conductive layer being provided to form a channel layer; a gate insulating layer formed on said second conductive layer; and a third conductive layer formed on said gate insulating layer, said third conductive layer being provided to form a gate electrode.

In the transistor, said first conductive layer is formed relatively thicker than said second conductive layer.

The method for fabricating a thin film transistor according to an additional aspect of the present invention, comprises the steps of sequentially depositing a first conductive layer and an interlayer insulating layer on a substrate; selectively etching said interlayer insulating layer and said first conductive layer using an etching mask, until a surface of said substrate is exposed, to form source and drain electrodes; sequentially forming a second conductive layer, a gate insulating layer and a third conductive layer between said source and drain electrodes and on said interlayer insulating layer remaining through said etching step, said second conductive layer being provided to form a channel and said third conductive layer being provided to form a gate electrode; and sequentially etching said third conductive layer, said gate insulating layer, said second conductive layer and said interlayer insulating layer using a gate forming mask.

In the method, said first conductive layer is formed relatively thicker than said second conductive layer.

In the method, each of said first, second and third conductive layer comprises polysilicon.

In the method, said interlayer insulating layer comprises oxide or nitride.

According to the present invention, because each of source and drain electrodes can be formed relatively thicker than the channel, the electrodes can be significantly reduced in resistance.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
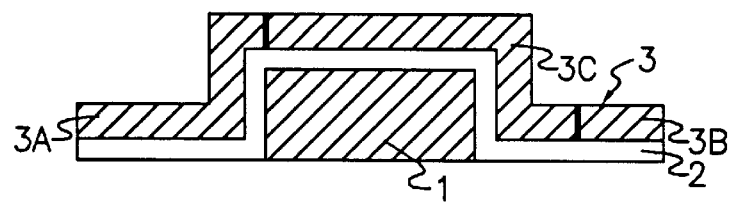
FIG. 1 is a cross-sectional view showing the construction of a prior art thin film transistor.
Figure 2:
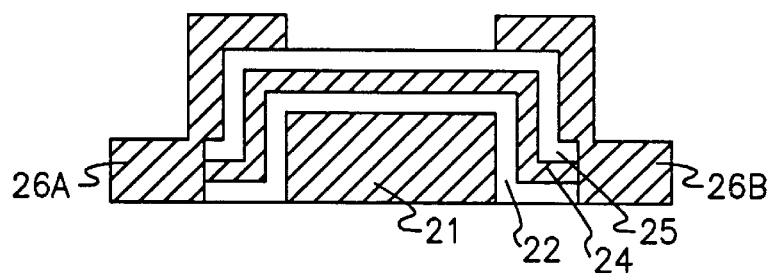
FIG. 2 is a cross-sectional view showing the construction of a thin film transistor in accordance with one embodiment of the present invention.

Referring to FIG. 2, the novel TFT structure in accordance with one embodiment of the invention is provided with a substrate (not shown), a gate layer 21 patterned on the substrate, a channel layer 24 formed on the gate layer 21 with a gate insulating layer 22 interposed therebetween, an interlayer insulating layer 25 formed on the channel layer 24, and source and drain layers 26A and 26B formed on both side walls of the channel layer 24 and on both side portions of the interlayer insulating layer 25, and isolated from each other. Each of the gate, channel and source/drain layers is composed of polysilicon having conductivity. Importantly, the channel and source/drain layers are stacked with each other, and they are isolated from each other by the interlayer insulating layer 25 in the vicinity of both side portions of the channel layer and electrically connected with each other at both edges of the channel layer.

In the TFT, as shown in FIG. 2, the channel 24 and source/drain layers are separately formed, thereby making the source/drain layer possible to be formed relatively thick to the channel layer 24.

Figure 3:
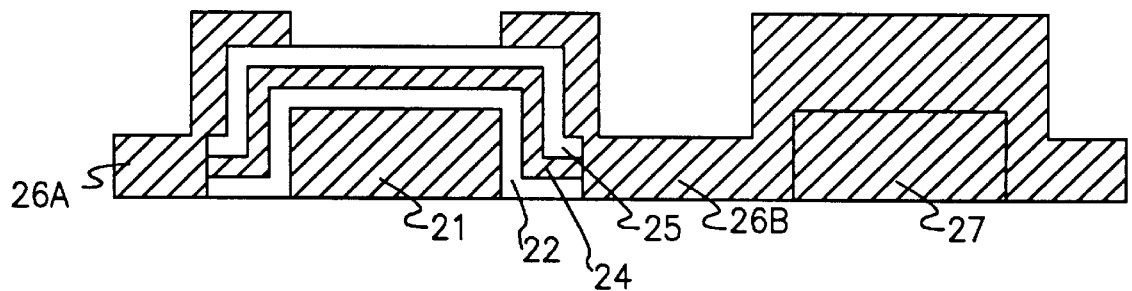
FIG. 3 is a cross-sectional view showing the construction of a static random access memory in which the thin film transistor of FIG. 2 is embodied.

FIG. 3 is a cross-sectional view of the SRAM in which the TFT of FIG. 2 is embodied. The same components as those in FIG. 2 are indicated by the same reference numerals, and hence descriptions thereof are omitted.

In the SRAM of FIG. 3, if, for example, a voltage is applied to the gate 21, the TFT is conductive. Then, a current flows from the source electrode 26A to the drain electrode 26B through the channel 24. The current applied to the drain electrode 26B also is applied to the gate of an adjacent TFT through a connecting polysilicon layer 27. The connecting polysilicon layer 27 is formed during patterning the gate layer 21 and provided to electrically connect two adjacent TFT's. Particularly, because the connecting polysilicon layer 27 is directly contact with the drain electrode 26B, an additional process is not required for forming a drain contact.

Hereinafter, the method for fabricating the TFT of the present invention will be described with reference to FIGS. 4A through 4D.

Figure 4A:
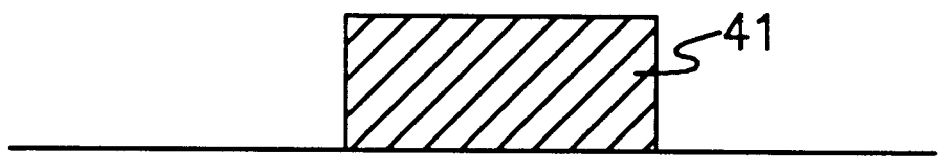
FIGS. 4A through 4D are diagrams illustrating, by sequential cross-sectional representation the process steps of a novel method for fabricating the thin film transistor of FIG. 2 in accordance with the present invention.

Referring to FIG. 4A, on the main surface of a substrate (not shown) of insulating material, such as a glass plate, a polysilicon layer is deposited. Impurity ions are injected into the polysilicon layer so that the polysilicon layer has a conductivity. After injection of impurity ions into the polysilicon layer, the polysilicon layer is patterned using a gate forming mask to form a gate electrode 41. In this embodiment, a patterned photoresist layer can be used as the gate forming mask. Alternatively, the gate electrode 41 can be formed by only one process for depositing a polysilicon layer on the substrate under the conditions that impurity ions are supplied in a polysilicon depositing apparatus.

Figure 4B:
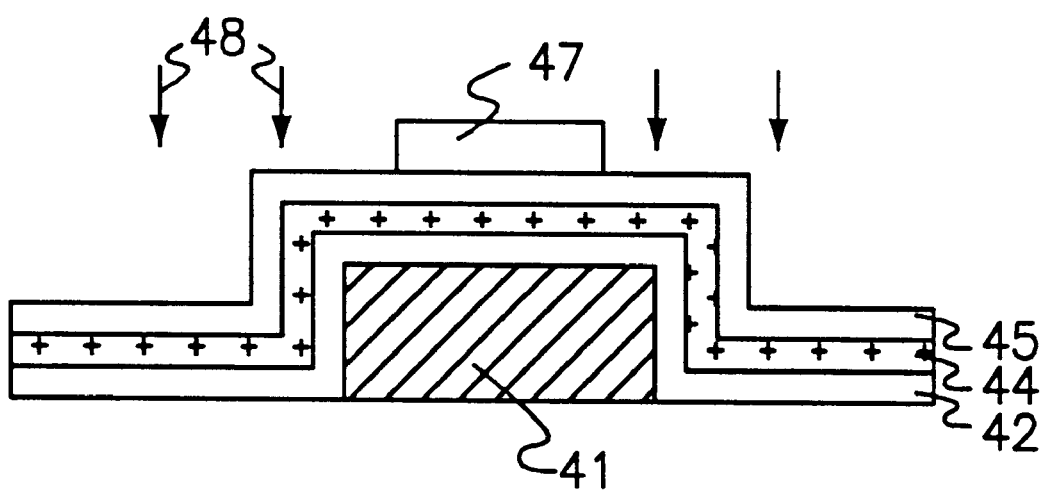

Next, on the gate electrode 41 and the substrate, a gate oxide layer 42, a channel layer 44 of polysilicon and an interlayer insulating layer 45 are sequentially formed, as shown in FIG. 4B. Then, a patterned photoresist layer 47 is deposited on the interlayer insulating layer 45 and used as a mask necessary for performing a well-known lightly doping offset in the art. Through the lightly doping offset, impurity-ions 48 are injected into the channel layer 44 using the patterned photoresist layer 47 as an ion-injecting mask. The interlayer insulating layer 45 is formed between the channel layer 44 and a source/drain electrode to be formed by following process. As an insulating material for the interlayer insulating layer 45, oxide or nitride can be mainly used.

Figure 4C:
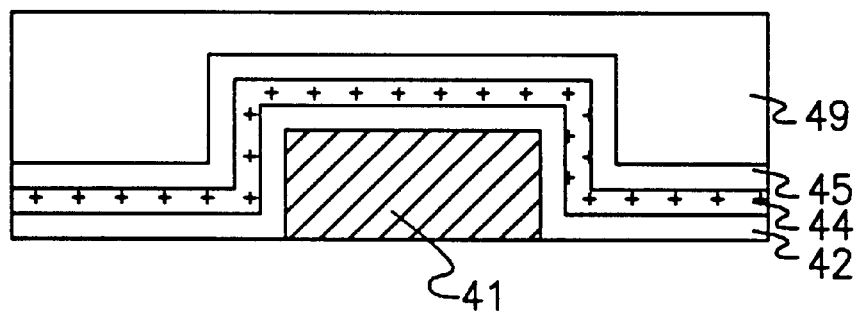
Figure 4D:
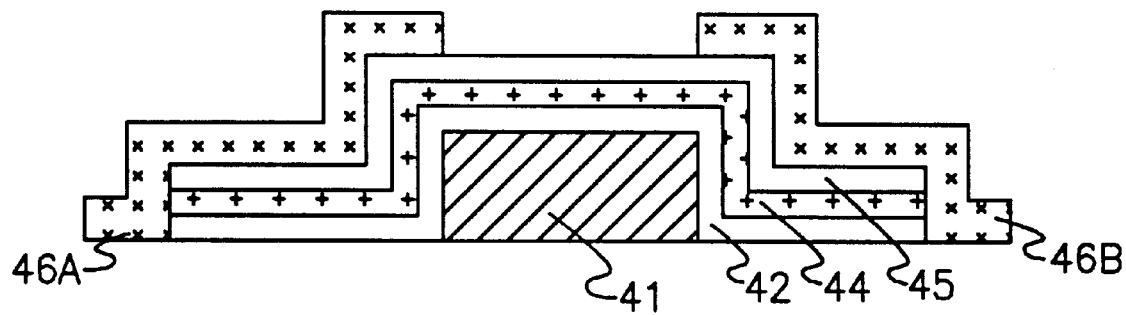

After removal of the photoresist layer 47, as shown in FIG. 4C, a patterned photoresist layer 49 is again deposited on the interlayer insulating layer 45 and an etching process is performed until the main surface of the substrate is exposed. Then, the interlayer insulating layer 45, the channel layer 44 and the gate insulating layer 42 are sequentially removed using the patterned photoresist layer 49 as an etching mask, and thus both side portions of the channel layer 44 are exposed to make it possible to be electrically connected to source and drain electrodes. subsequently, a relatively thick polysilicon layer compared to the channel layer 44 is deposited on the interlayer insulating layer 45 and the exposed surface of the substrate after removal of the photoresist layer 49, and a photoresist layer (not shown) is deposited on the thick polysilicon layer. Next, a patterning process is performed to form a patterned photoresist layer. Using the patterned photoresist layer as a source/drain forming mask, a selectively etching process of the thick polysilicon layer is performed. Thus, source and drain electrodes 46A and 46B are formed as shown in FIG. 4D.

In formation of the source and drain electrodes 46A and 46B, they can be formed by only one process for depositing a polysilicon layer on the interlayer insulating layer 45 and the exposed surface of the substrate under the conditions that impurity ions are supplied in a polysilicon depositing apparatus. Alternatively, they can be formed by depositing a polysilicon layer and injecting impurity ions into the polysilicon layer before performing a selectively etching process.

Figure 5:
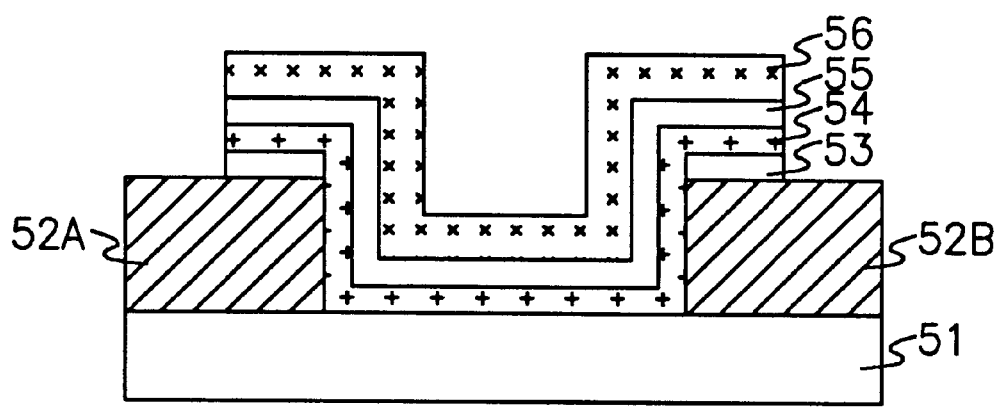
FIG. 5 is a cross-sectional view showing the construction of a thin film transistor in accordance with another embodiment of the present invention.

FIG. 5 shows the structure of the novel TFT in accordance with the second embodiment of the invention. The TFT has a substrate 51 of insulating material, a patterned polysilicon layer formed on the substrate 51 and provided to form source and drain electrodes 52A and 52B, a channel layer 54 formed between the source and drain electrodes and upward the electrodes with an insulating layer 53 interposed therebetween, a gate oxide layer 55 formed on the channel layer 54, and a gate electrode 56 of polysilicon formed on the gate oxide layer 55.

Similarly to the TFT structure in accordance with the first embodiment, as shown in FIG. 5, the channel layer 54 and the source/drain electrode are stacked with each other, and isolated from each other by the insulating layer 53 at the upward side of the source/drain electrode. Also, they are composed of polysilicon implanted with impurity ions, and side walls of them are electrically contacted with the channel layer.

In addition, as shown in FIG. 5, the channel layer 54 and the source/drain electrode are separately formed, thereby making the source/drain electrode possible to be formed relatively thick to the channel layer 54. In this embodiment, on the channel layer 54, the gate oxide layer 55 and the gate electrode 56 are sequentially formed.

Hereinafter, the method for fabricating the TFT according to the second embodiment will be described with reference to FIGS. 6A through 6D.

Figure 6A:
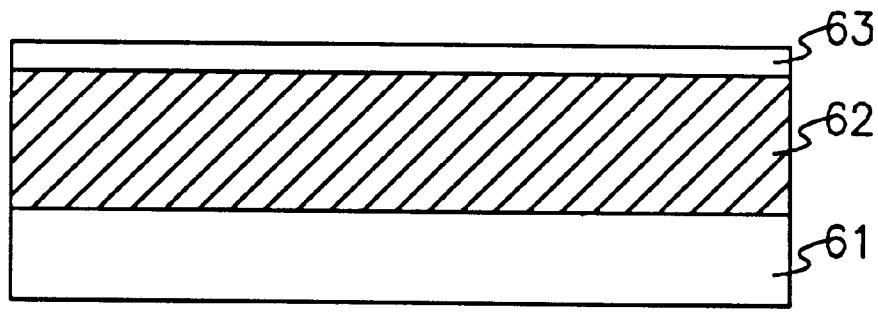
FIGS. 6A through 6D are diagrams illustrating, by sequential cross-sectional representation, the process steps of a novel method for fabricating the thin film transistor of FIG. 5 in accordance with the present invention.

Referring to FIG. 6A, on a substrate 61 of insulating material, such as a glass plate, a polysilicon layer 62 and an interlayer insulating layer 63 are sequentially formed. The polysilicon layer 62 is injected with impurity ions by means of a well-known ion injection in the art, and provided to form a source/drain electrode. As the interlayer insulating layer 63, an oxide layer or a nitride layer is used.

Figure 6B:
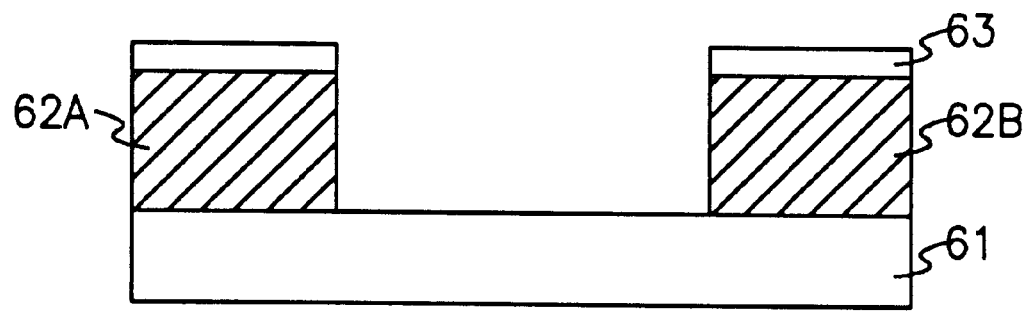

Next, a patterned photoresist layer (not shown) is deposited on. the interlayer insulating layer 63 and an etching process is performed. Then, the interlayer insulating layer 63 and the polysilicon layer 62 are sequentially removed using the patterned photoresist layer as an etching mask until the surface of the substrate 61 is exposed, as shown in FIG. 6B. By selectively removing the polysilicon layer 62, portions which are not removed are defined as a source electrode 62A and a drain electrode 62B, respectively.

Figure 6C:
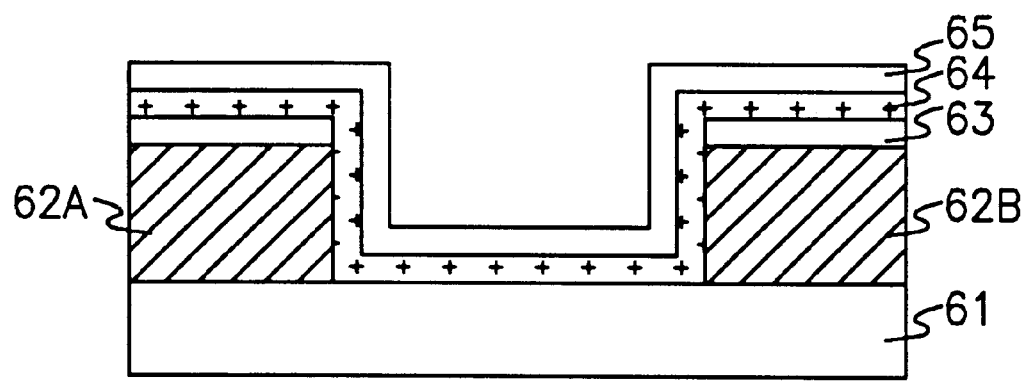

After removal of the patterned photoresist layer (not shown), as shown in FIG. 6C, a polysilicon layer 64 is deposited between the source and drain electrodes 62A and 62B and on the remaining interlayer insulating layer 63 and then injected with impurity ions by means of the ion injection. The polysilicon layer is provided to form a channel layer 64.

Subsequently, on the channel layer 64, a gate oxide layer 65 and a polysilicon layer are sequentially formed. The polysilicon layer formed on the gate oxide layer 65 is injected with impurity ions by the ion injection and provide to form a gate electrode 66.

Figure 6D:
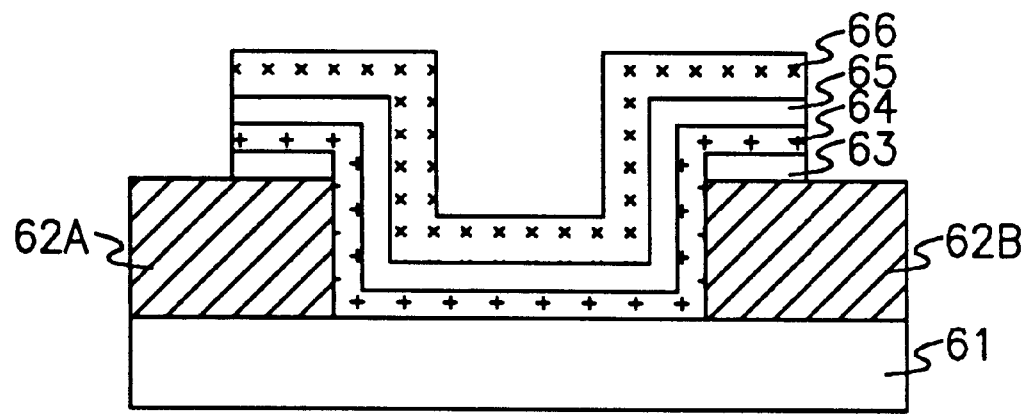

Finally, as shown in FIG. 6D, a patterned photoresist layer (not shown) is deposited on the polysilicon layer 66 with impurity ions. Using the patterned photoresist layer as a gate forming mask, the polysilicon layer 66 with impurity ions is selectively removed, and thereby the gate electrode 66 is formed. Also, the gate oxide layer 65, the channel layer 64 and the interlayer insulating layer 63 are sequentially removed using the gate forming mask, as shown in FIG. 6D.

As above described according to this invention, because a polysilicon layer for a source/drain electrode can be formed relatively thicker than a channel layer, the source/drain electrode is significantly reduced in resistance. Therefore, the TFT of the present invention can be considerably improved in ON current.

In addition, if, for example, the TFT of the present invention is applied to an SRAM cell, it is possible to omit an additional process for forming a drain contact in fabrication of the SRAM. Therefore, the TFT can be prevented from an damage of a gate oxide layer to be caused due to the drain contact forming process, whereby characteristics of the TFT can be improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a thin film transistor on a substrate, said method comprising the steps of:

sequentially depositing a first conductive layer and an interlayer insulating layer on said substrate;

selectively etching said interlayer insulating layer and said first conductive layer using an etching mask, until a surface of said substrate is exposed, to form source and drain electrodes;

sequentially forming a second conductive layer, a gate insulating layer and a third conductive layer between said source and drain electrodes and on said interlayer insulating layer remaining through said etching step, said second conductive layer being provided to form a channel and said third conductive layer being provided to form a gate electrode; and sequentially etching said third conductive layer, said gate insulating layer, said second conductive layer and said interlayer insulating layer using a gate forming mask.

2. The method as defined in claim 1, wherein said first conductive layer is formed relatively thicker than said second conductive layer.

3. The method as defined in claim 2, wherein each of said first, second and third conductive layer comprises polysilicon.

4. The method as defined in claim 3, wherein said interlayer insulating layer comprises oxide or nitride.

* * * * *